(12) United States Patent
Lin et al.

(10) Patent No.: US 6,332,792 B1
(45) Date of Patent: Dec. 25, 2001

(54) RETENTION DEVICE

(75) Inventors: Wei-Chung Lin; Shun-Chi Tung, both of Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/418,186

(22) Filed: Oct. 13, 1999

(30) Foreign Application Priority Data

Jul. 2, 1999 (TW) .............................. 88211058 U

(51) Int. Cl.[7] .................................................. H01R 13/62
(52) U.S. Cl. ............................................. 439/160; 439/328
(58) Field of Search ...................................... 439/328, 160, 439/327, 358, 487

(56) References Cited

U.S. PATENT DOCUMENTS 6,074,231 * 6/2000 Ju ........................................ 439/327

* cited by examiner

Primary Examiner—Neil Abrams

(57) ABSTRACT

A retention device for retaining a combination of a daughter card and a heat sink mounted on the daughter card to an electrical connector comprises a pair of retention mechanisms positioned on opposite ends of the electrical connector. Each retention device includes a base and a wall upwardly extending from the base. The wall defines a pair of vertical grooves which divide the wall into a pair of sidewall portions and a central wall portion. A pair of central blades and a pair of side blades inwardly extend from the central wall portion and the sidewall portions, respectively. The central wall portion of each retention mechanism forms a push bar at a free end thereof. The central wall portion and the central blades of each retention mechanism are outwardly flexible under a lower force, relative to the sidewall portions, and then revert to lock the daughter card and the heat sink to the electrical connector. Furthermore, each central blade forms a stopper laterally extending from a bottom edge thereof toward a proximate side blade to exert an ejecting force on a bottom edge of the heat sink when the central wall portion is deflected outward during ejection of the daughter card.

13 Claims, 7 Drawing Sheets

RETENTION DEVICE

BACKGROUND OF THE INVENTION

1. Field of the Invention

The present invention relates to a retention device, and particularly to a retention device for retaining a combination of a daughter card and a heat sink mounted on the daughter card to an electrical connector.

2. Description of the Prior Art

Taiwan Patent Application Nos. 86207711, 86207803 and 86211054 each discloses a retention device. Referring to FIG. 1, a conventional retention device 8 comprises a base 80 and a pair of vertical frames 81 positioned at opposite ends of the base 80. Each vertical frame 81 defines an opening 83 in distal end of a central board 82 thereof. Correspondingly, a daughter card 84 forms a pair of projections 85 on opposite side edges thereof. In assembly, the vertical frames 81 are outwardly expanded so that the daughter card 84 can be downwardly accommodated therebetween. The projections 85 are received in corresponding openings 83 thereby preventing a disengagement of the daughter card 84 from the retention device 8.

Referring to FIG. 2, a second conventional retention device 9 comprises a base 90, a pair of vertical frames 93 disposed at opposite ends of the base 90, and a pair of locking members 91 each being mounted to a corresponding vertical frame 93. Each vertical frame 93 defines an opening 96. Each locking member 91 forms a spring arm 94, forming a projection 95 thereon, in one lateral face thereof and defines a groove 97 in an opposite lateral face thereof. In operation, a daughter card 92 and a heat sink 98 mounted on the daughter card 92 are downwardly assembled in the retention device 9 with opposite side edges thereof retained in the vertical frames 93. The locking members 91 are then downwardly assembled to corresponding vertical frames 93 with the projections 95 thereof received in corresponding openings 96 and the grooves 97 accommodating top edges (not labeled) of the daughter card 92, thereby retaining the daughter card 92 and the heat sink 98 in the retention device 9.

However, one or more disadvantages may exist in the above conventional retention devices. First, the vertical frames 81, 93 are very stiff and the force needed to expand them outward is very large. Second, the retention devices 8, 9 do not have a card ejector, so ejection of the daughter cards 84, 92 from corresponding electrical connectors (not shown) may be difficult. Hence, an improved retention device is required to overcome the disadvantages of the prior art.

BRIEF SUMMARY OF THE INVENTION

An object of the present invention is to provide a retention device including a pair of retention mechanisms mounted on opposite ends of an electrical connector wherein a portion of each retention mechanism can be deflected under a lower force for inserting a daughter card therein.

Another object of the present invention is to provide a retention device including a pair of retention mechanisms mounted on opposite ends of an electrical connector wherein each retention mechanism includes a card ejection mechanism to aid ejection of a daughter card from the electrical connector.

In order to achieve the foregoing objects, the retention device of the present invention comprises a pair of retention mechanisms positioned at opposite ends of the electrical connector to which a combination consisting of a daughter card and a heat sink mounted on the daughter card is inserted. Each retention device includes a base and a wall upwardly extending from the base. The wall defines a pair of grooves which divide the wall into a pair of sidewall portions and a central wall portion. A pair of central blades and a pair of side blades inwardly extend from the central wall portion and the sidewall portions, respectively. When the combination of the daughter card and the heat sink is assembled to the electrical connector, the central wall portion together with the central blades of each retention mechanism is outwardly deflected, and the side blades then recover to lock the daughter card and the heat sink.

The central wall portion of each retention mechanism forms a push bar at a free end thereof, the push bar being inwardly offset a predetermined distance therefrom. The push bar is wider than the central wall portion and is distanced from corresponding sidewall portions and side blades. The pair of grooves in the wall extends to a level lower than bottom edges of the blades thereby greatly increasing the resilience to the central wall portion so that the central wall portion and the central blades are easily deflected outwardly.

Each central blade forms a stopper laterally extending from a bottom edge thereof toward a proximate side blade and each side blade forms a stopper laterally extending from a bottom edge thereof toward a proximate central blade. When the central wall portion and the central blades are outwardly deflected, the stoppers of the central blades move upwardly to abut against a bottom edge of the heat sink and eject the heat sink and the daughter card out of the electrical connector.

Other objects, advantages and novel features of the invention will become more apparent from the following detailed description of the present embodiment when taken in conjunction with the accompanying drawings.

DETAILED DESCRIPTION OF THE INVENTION

Figure 1:
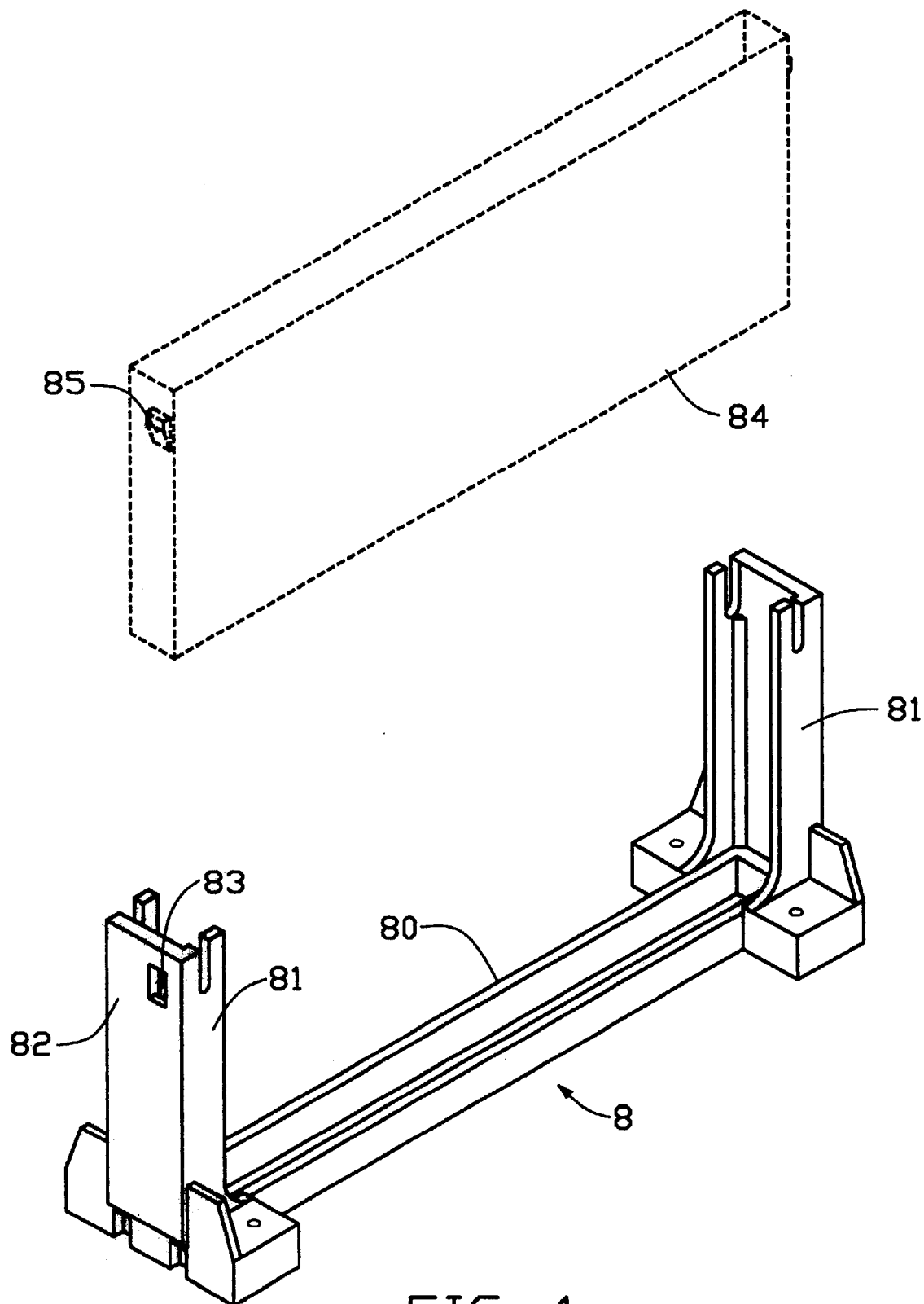
FIG. 1 is a perspective view of a conventional retention device.
Figure 2:
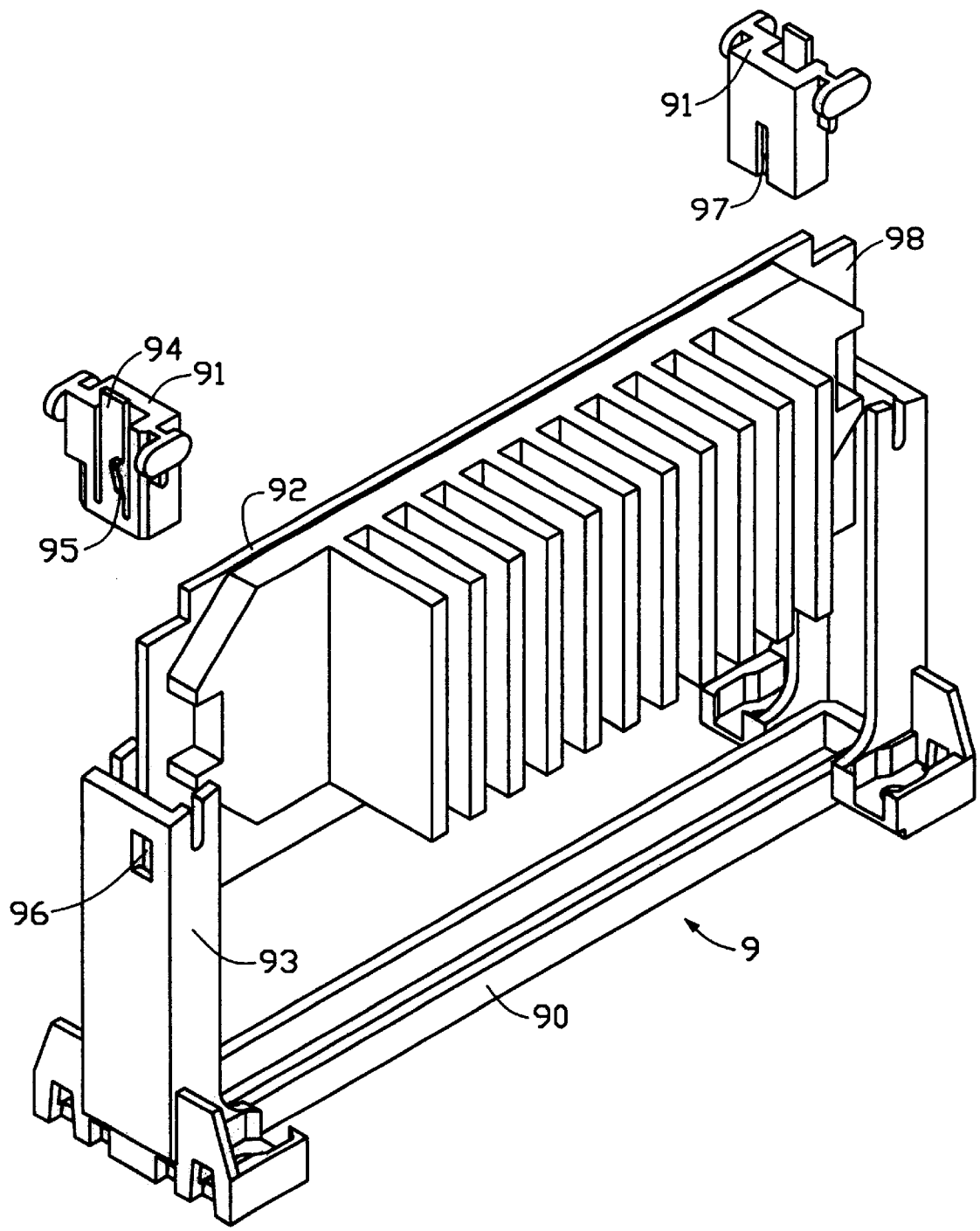
FIG. 2 is a perspective view of an assembly of another conventional retention device and a combination of a daughter card and a heat sink.
Figure 3:
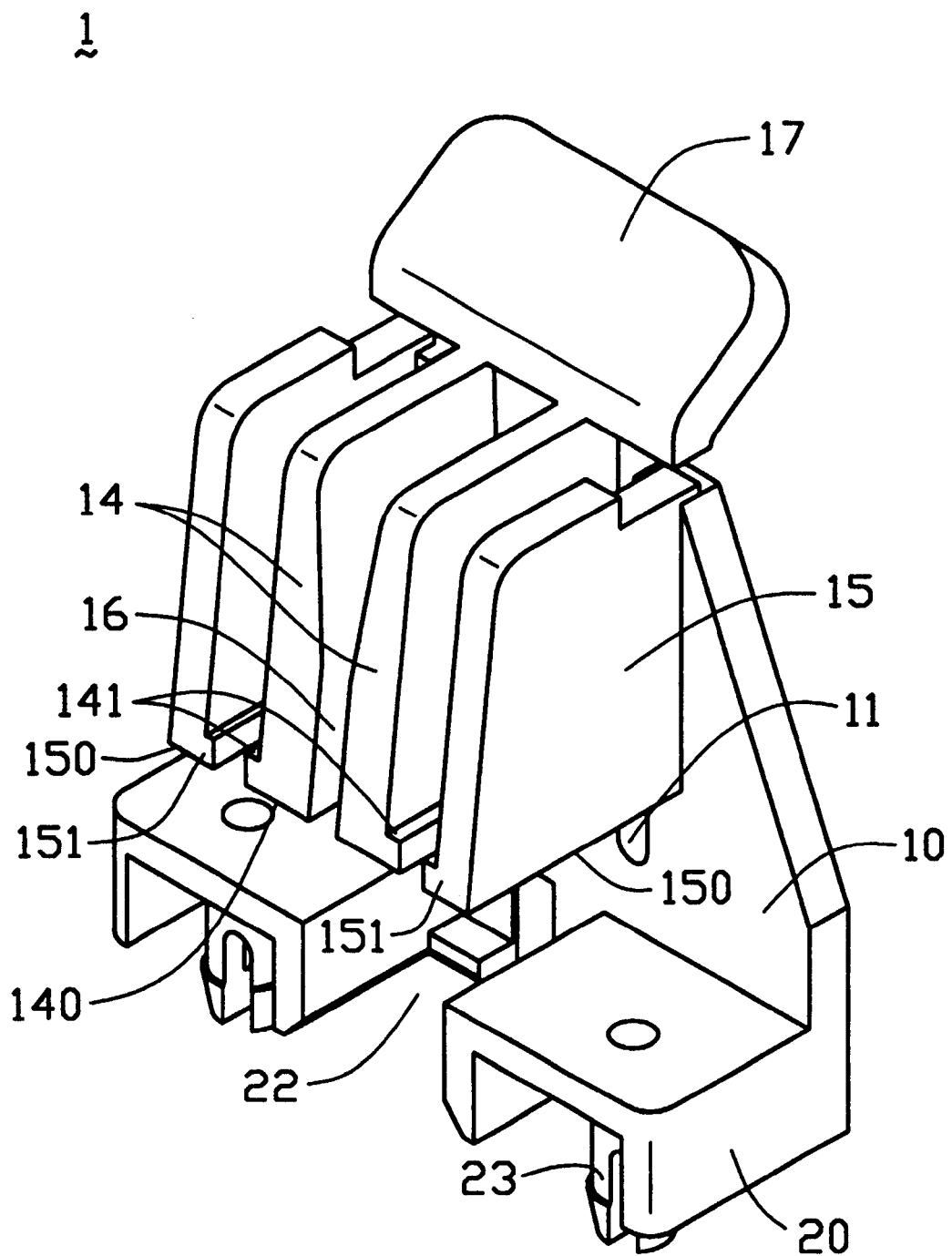
FIG. 3 is a perspective view of a retention mechanism in accordance with the present invention.
Figure 4:
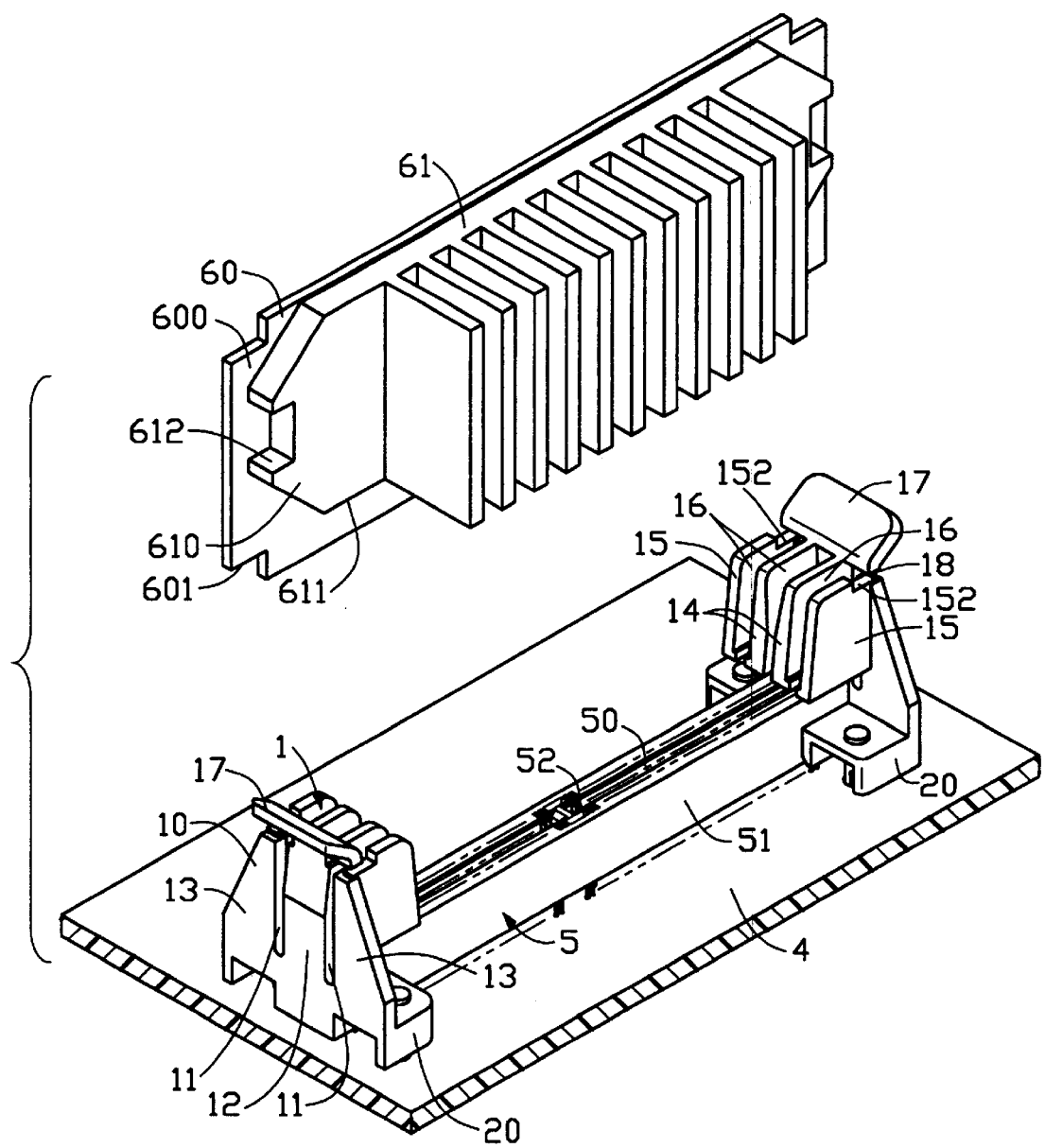
FIG. 4 is a perspective view of the retention device of FIG. 3 with the combination of the daughter card and the heat sink prior to insertion into the electrical connector.

Referring to FIGS. 3 and 4, a retention device of the present invention comprises a pair of retention mechanisms 1 mounted on opposite ends of an electrical connector 5 to secure a combination of a daughter card 60 and a heat sink 61 mounted on the daughter card 60 to the electrical connector 5. The electrical connector 5 and the pair of retention mechanisms 1 are mounted on a printed circuit board 4. The electrical connector 5 comprises an insulative housing 51 and a plurality of contacts 52 received in the housing 51. The housing 51 defines a slot 50 for accommodating a bottom edge of the daughter card 60.

Each retention mechanism 1 comprises a base 20 and a wall 10 upwardly extending from the base 20. The base 20 defines a space 22 in a middle section thereof for accommodating a corresponding end of the electrical connector 5. The base 20 forms a pair of board locks 23 downwardly extending therefrom for securing to the printed circuit board 4. The wall 10 defines a pair of grooves 11 to divide the wall 10 into a pair of sidewall portions 13 and a central wall portion 12. A pair of central blades 14 and a pair of side blades 15 inwardly extend from the central wall portion 12 and the sidewall portions 13, respectively. A gap 16 is defined between each proximate pair of blades 14, 15 for accommodating corresponding opposite edges 600 of the daughter card 60 and corresponding opposite edges 610 of the heat sink 61. The grooves 11 of the wall 10 extend to a level lower than bottom edges 140, 150 of the blades 14, 15 thereby greatly increasing the flexibility of the central wall portion 12 so that the central wall portion 12 and the central blades 14 are easily deflected. Each central blade 14 forms a stopper 141 laterally extending from the bottom edge 140 thereof toward a proximate side blade 15 and each side blade 15 forms a stopper 151 laterally extending from the bottom edge 150 thereof toward a proximate central blade 14.

The central wall portion 12 of each retention mechanism 1 forms a push bar 17 at a free end thereof which is inwardly offset a predetermined distance from the central wall portion 12 so that a bottom edge 18 of the push bar 17 can be received in a cutout 612 of the side edge 610 of the heat sink 61 to present the combination from the electrical connector 5. The push bar 17 is wider than the central wall portion 12. Each side blade 15 defines a cutout 152 in a top portion thereof to disconnect the push bar 17 therefrom.

Figure 5:
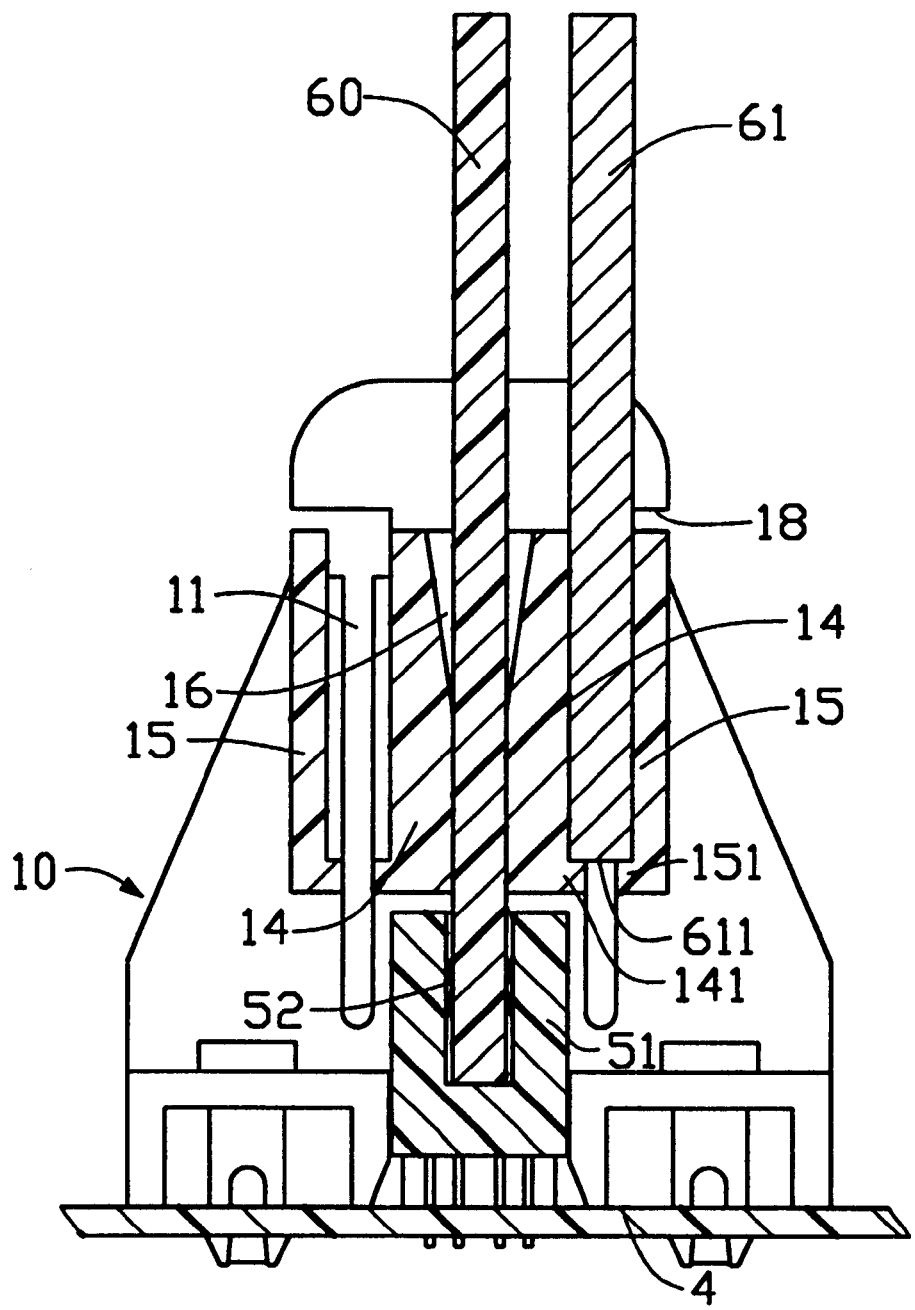
FIG. 5 is a cross-sectional view of the assembled assembly of FIG. 4.
Figure 6:
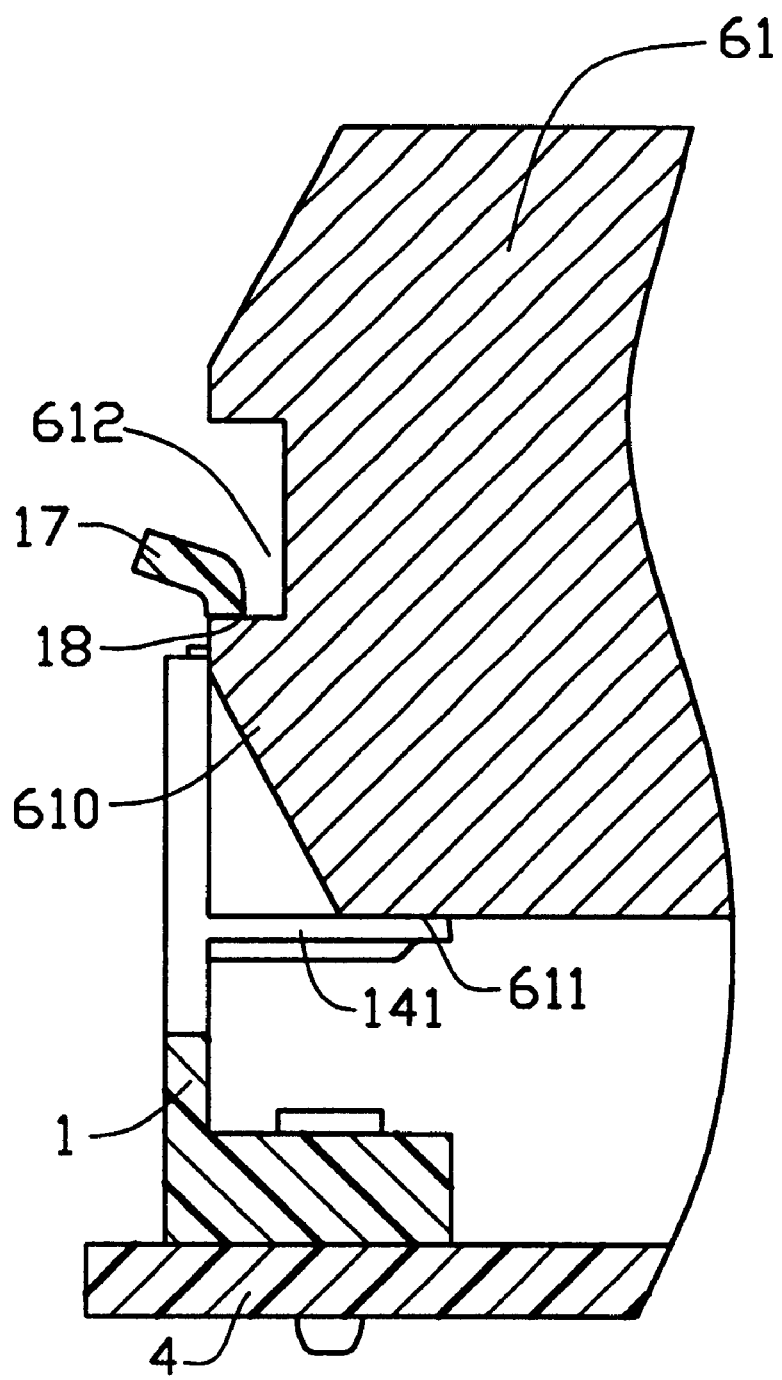
FIG. 6 is a view similar to FIG. 5 but taken from a different perspective.
Figure 7:
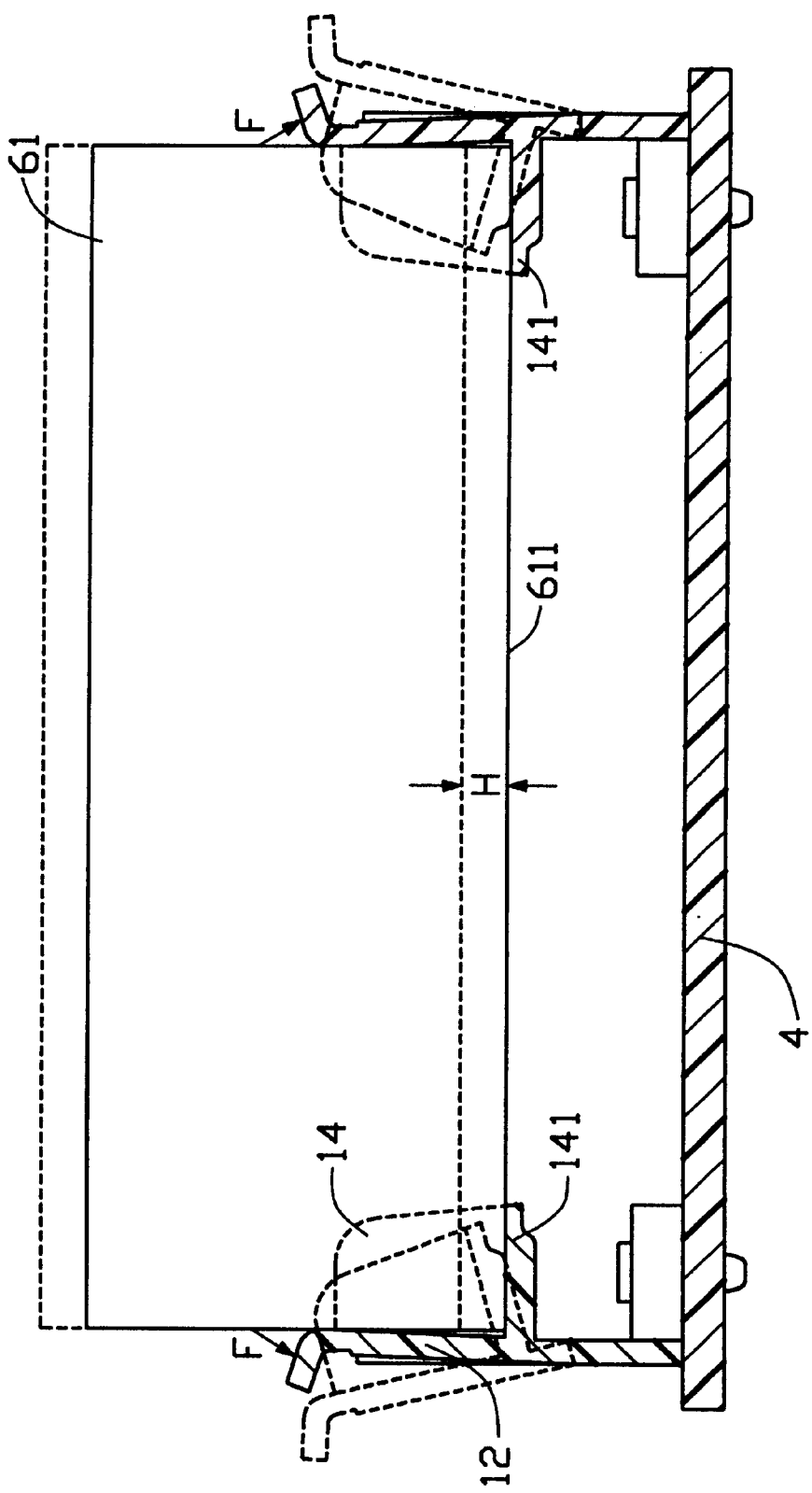
FIG. 7 is a view similar to FIG. 6 illustrating the process of ejecting the combination of the daughter card and the heat sink from the electrical connector.

Also referring to FIGS. 5–7, in operation, an external force F is exerted on the push bars 17 to outwardly deflect the central wall portion 12 and the central blades 14 relative to the sidewall portions 13 and the side blades 15. The combination is then downwardly assembled to the electrical connector 5. The opposite side edges 600 and 610 are respectively received in the gaps 16 and the bottom edge 611 of the heat sink 61 abuts against the stoppers 141, 151. The central wall portion 12 then reverts to lock the daughter card 60 and the heat sink 61 to the electrical connector 5. A bottom edge 601 of the daughter card 60 is received in the slot 50 of the housing 51.

Since the central wall portion 12 and the push bar 17 are separated from the sidewall portions 13 and the side blades 15, the central wall portion 12 is flexible. Thus, when the daughter card 60 and the heat sink 61 are assembled into the electrical connector 5, the insertion force is low.

When the daughter card 60 and the heat sink 61 are wanted to be disassembled from the electrical connector 5, an external force F is exerted on the push bar 17 to outwardly deflect the central wall portion 12 and the central blades 14. The bottom edge 18 of the push bar 17 disengages from the cutout 612 of the heat sink 61 and the stoppers 141 of the central blades 14 move upwardly to abut against the bottom edge of the heat sink 61, thereby ejecting the combination of the daughter card 60 and the heat sink 61 out of the electrical connector 5.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical system comprising:
   an electrical connector including a dielectric housing and a plurality of contacts received in the housing;
   a pair of retention mechanisms positioned on opposite ends of the electrical connector, each retention mechanism including a base and a wall upwardly extending from the base, the wall defining a pair of grooves to divide the wall into a pair of sidewall portions and a central wall portion, a pair of central blades, and a pair of side blades inwardly extending from the central wall portion and the sidewall portions, respectively; and
   a combination of a daughter card and a heat sink mounted on the daughter card, opposite side edges of the daughter card and the heat sink being accommodated between the central blades and between one central blade and one side blade, respectively, the daughter card being electrically connected to the contacts in the housing;
   the central wall portion and the central blades of each retention mechanism being outwardly deflectable relative to the sidewall portions and the side blades upon insertion of the daughter card and the heat sink combination to the electrical connector and being then movable inwardly to lock the daughter card and the heat sink combination.

2. The electrical system as claimed in claim 1, wherein the pair of grooves extends to a level lower than bottom edges of the blades.

3. The electrical system as claimed in claim 2, wherein at least one of the central blades forms a stopper laterally extending from a bottom edge thereof toward a proximate side blade.

4. The electrical system as claimed in claim 2, wherein at least one of the side blades forms a stopper laterally extending from a bottom edge thereof toward a proximate central blade.

5. The electrical system as claimed in claim 1, wherein the central wall portion of each retention mechanism forms a push bar at a free end thereof, the push bar being inwardly offset a predetermined distance from the central wall portion and being wider than the central wall portion.

6. The electrical system as claimed in claim 5, wherein each side blade defines a cutout in a top portion thereof to disconnect the push bar therefrom.

7. The electrical system as claimed in claim 1, wherein the base of each retention mechanism defines a space for accommodating a corresponding opposite end of the electrical connector.

8. An electrical system comprising:
   an electrical connector including a dielectric housing and a plurality of contacts received in the housing;
   a pair of retention mechanisms positioned on opposite ends of the electrical connector, each retention mechanism including a base and a wall upwardly extending from the base, the wall forming a pair of blades in an inner surface thereof, at least one of the blades forming a stopper extending toward the other blade; and
   a combination of a daughter card and a heat sink, the heat sink being attached to the daughter card, the combination being positioned between the retention mechanisms, the daughter card being electrically connected to the contacts of the connector, opposite side edges of the heat sink being accommodated between the blades, the wall of each retention mechanism being outwardly deflectable to upwardly move the stopper to abut against a bottom edge of the heat sink, thereby ejecting the combination out of the connector.

9. The electrical system as claimed in claim 8, wherein the stopper is formed at a bottom edge of each blade.

10. The electrical system as claimed in claim 9, wherein the wall defines a pair of grooves to divide the wall into a pair of sidewall portions and a central wall portion.

11. The electrical system as claimed in claim 10, wherein the central wall portion of each retention mechanism forms a push bar at a free end thereof, the push bar being inwardly offset a predetermined distance from the central wall portion and being wider than the central wall portion.

12. The electrical system as claimed in claim 11, wherein the push bar is disconnected from the sidewall portions.

13. An electrical system comprising:

a printed circuit board;

a connector mounted on the printed circuit board;

a pair of retention devices mounted on the printed circuit board and positioned by two ends of the connector;

a combination of a daughter board and an associated heat sink mounted thereon, being positioned in a space defined among said pair of retention devices and the connector, a bottom edge portion of the daughter board being mechanically and electrically connected to the connector;

each of said retention devices defining first means for latchably holding the heat sink in position and second means for releasably withdrawing said combination from the connector, said first means including a pair of blades for sandwiching the heat sink therebetween, and a bottom edge around a push bar for latchable receipt within a notch of the heat sink, said second means including a deflectable central wall on which the push bar and at least one of the said pair of blades is formed, and a stopper formed at a bottom edge of said one of the pair of blades to abut against the heat sink, so that by deflecting the central wall, the bottom edge of the push bar may leave the notch of the heat sink, and the stopper may upwardly move to urge heat sink and the associated daughter board to leave away the connector thereunder.

* * * * *